United States Patent [19]
Prins et al.

[11] Patent Number: 4,833,328
[45] Date of Patent: May 23, 1989

[54] FORMING CONTACTS ON DIAMONDS

[76] Inventors: Johan F. Prins, Johannesburg; Tom L. Nam, Bez Valley; Rex J. Keddy, Rivonia, all of South Africa

[21] Appl. No.: 65,311

[22] Filed: Jun. 22, 1987

[30] Foreign Application Priority Data

Jun. 20, 1986 [ZA] South Africa ........................ 86/4614

[51] Int. Cl.$^4$ .............................................. G01T 1/22
[52] U.S. Cl. .................................... 250/370.01; 437/3
[58] Field of Search ..................... 250/370 R; 437/2, 3

[56] References Cited

U.S. PATENT DOCUMENTS

| | | | |
|---|---|---|---|
| 3,383,567 | 5/1968 | King et al. ............................ | 357/10 |
| 3,665,193 | 5/1972 | Kozlov et al. .................... | 357/29 X |
| 4,609,520 | 9/1986 | Kronenberg ............... | 250/370 R X |

OTHER PUBLICATIONS

Peterstrom et al., Semiconductor Counters for Nuclear Radiations Produced by Ion Implantation, Nuclear Instruments and Methods 119, No. 1, (Jul. 1, 1974), pp. 151–155, Cl 250/370.

Primary Examiner—Eugene R. Laroche
Assistant Examiner—Robert J. Pascal
Attorney, Agent, or Firm—Scully, Scott, Murphy & Presser

[57] ABSTRACT

The invention provides a method of preparing a detector which is sensitive to ionizing radiation or atomic emissions. The method includes the steps of forming at least two discrete conductive regions on a counting diamond by ion implantation, at a temperature below 500° C. Subsequently, contacts are applied to the conductive regions to allow charged carriers liberated by the radiation to be detected by an electronic circuit. The invention extends to a detector prepared according to the method. An example of a detector according to the invention comprised a synthetic diamond having a paramagnetic nitrogen impurity concentration of less than 150 parts per million. Two conductive regions were formed on the diamond by bombardment with carbon ions, and contacts were formed on the conductive regions by the applications of silver-loaded epoxy paint.

20 Claims, 3 Drawing Sheets

FIG_1
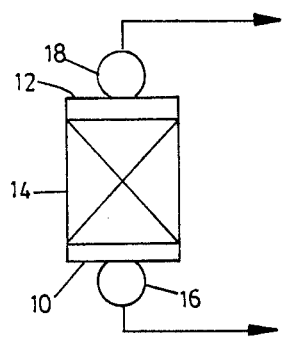
FIG_2
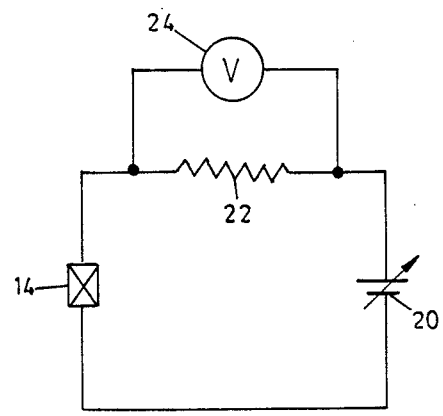
FIG_3
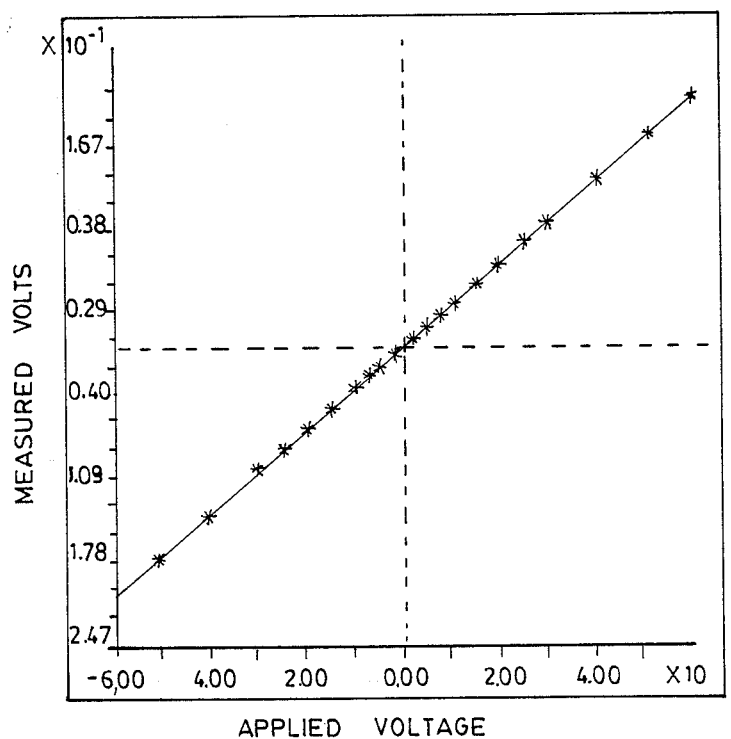

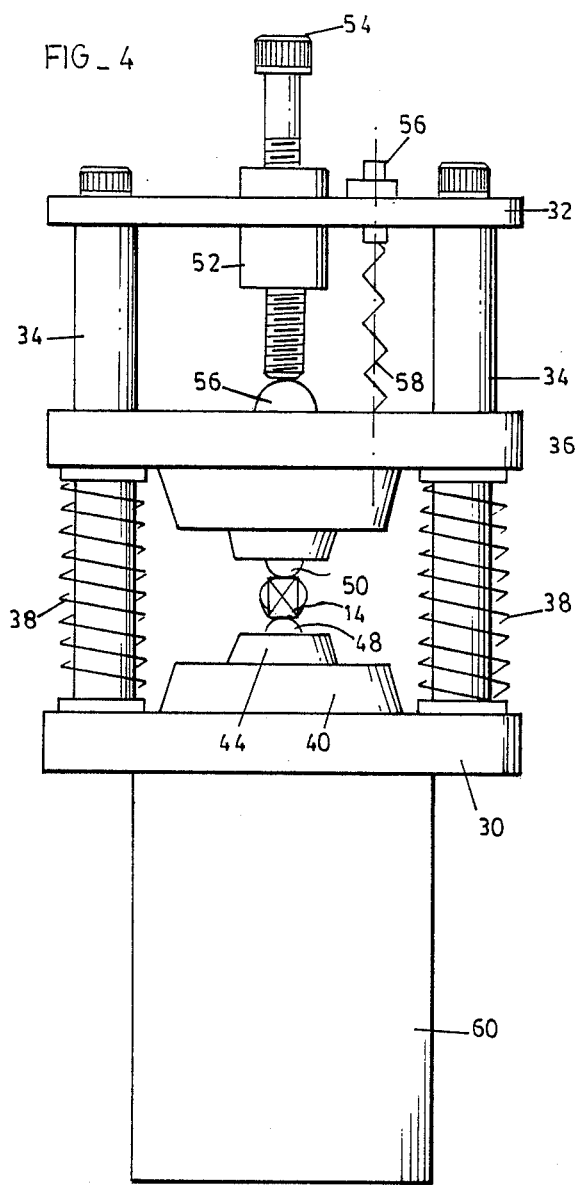

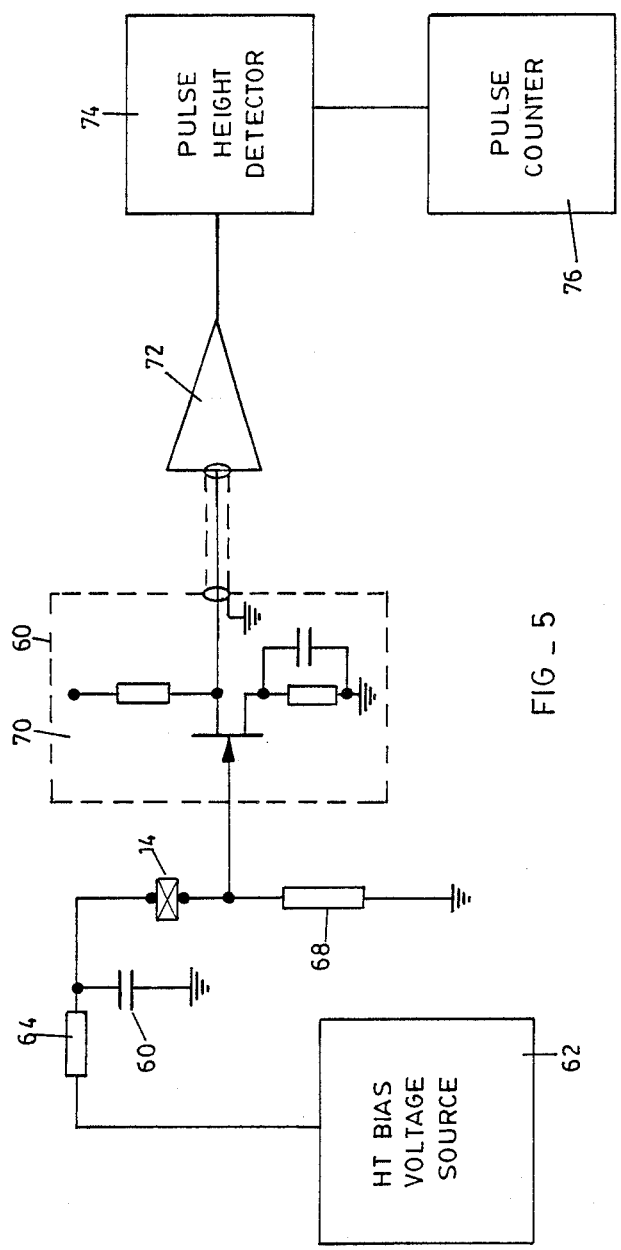
FIG_5

4,833,328

FORMING CONTACTS ON DIAMONDS

BACKGROUND OF THE INVENTION

This invention relates to the forming of contacts on a diamond which is used as a detector of ionizing radiation.

Counting diamonds are diamonds which can be used for detecting high energy ionizing radiation or energetic nuclear particles such as alpha particles, protons, or neutrons. Such diamonds are normally insulators or semi-conductors, to which an electrical potential is applied via spaced electrical contacts on the diamond. Ionizing radiation incident on the diamond causes the liberation of free charge carriers which are collected via the contacts and measured by means of an electrical circuit.

When a metallic conductor is attached to a non-conductor, the difference in the work functions of the metal and the non-conductor will result in a potential at the contact surface which will cause a uniform electric field spreading into the insulator. Depending on the direction of the field and the charge polarity of the carriers the field either aids or impedes the collection of the carriers. Furthermore, there may exist surface and intersurface electronic states which will further affect the field and the collection of carriers. The more intimate the contact between the non-conductor and the conductor material the more likely it is that the carriers will be transferred to the electronic circuit without hindrance.

Kozlov (U.S. Pat. No. 3,665,193) discloses a natural diamond radiation detector, with various kinds of contacts being applied to a diamond crystal to achieve electrical contact therewith. The contacts comprise metals such as gold, silver or platinum, or graphite, applied to the surface of the diamond. Typically a suspension containing the contact material is applied to the diamond, which is then heated to form a metal contact on the surface of the diamond. In another example, a gold layer is evaporated onto the surface of the diamond. It is believed, however, that such contacts are not ohmic.

SUMMARY OF THE INVENTION

According to the invention a method of preparing a detector which is sensitive to ionizing radiation or atomic emissions includes the steps of forming at least two discrete conductive regions on a counting diamond by ion implantation at a temperature below 500° C., and applying contacts to the conductive regions to permit charge carriers liberated by the radiation or emissions to be detected by an electronic circuit.

The diamond is preferably selected to have a paramagnetic nitrogen impurity concentration of less than 150 parts per million, as determined by ESR, or electron spin resonance, techniques.

The diamond is preferably a synthetic diamond.

The ions may be carbon ions, or selected metal ions.

The contacts may be metallic, or may comprise conductive epoxy resin.

The conductivity of the conductive regions may be improved by annealing of the diamond subsequent to ion implantation.

Further according to the invention a detector which is sensitive to ionizing radiation or atomic emissions comprises a counting diamond having two or more discrete conductive regions formed thereon, the conductive regions being formed by ion implantation at a temperature below 500° C., with contacts applied to the conductive regions to permit charge carriers liberated by the radiation or emissions to be detected by an electronic circuit.

BRIEF DESCRIPTION OF THE DRAWINGS

FIG. 1 is a schematic illustration of a detector according to the invention;

FIG. 2 is a schematic illustration of an elementary circuit including the detector of FIG. 1;

FIG. 3 is a graph showing the relationship between the voltage applied to the detector and the current flowing therethrough for a constant radiation dose rate;

FIG. 4 is a side view of a clamping jig holding a detector according to the invention; and FIG. 5 is a schematic block diagram of an electronic circuit including the detector.

DESCRIPTION OF A PREFERRED EMBODIMENT

Apparatus for carrying out ion implantation normally includes a source for producing a beam of ions, an accelerator for accelerating the ions to a desired energy, and a filter or discriminator for removing unwanted particles from the ion beam. Horizontal and vertical deflection plates are usually provided to allow the ion beam to be deflected or "scanned", to allow accurate targeting of the ion beam onto the target diamond. An example of such apparatus is described in U.S. Pat. No. 3,383,567 to King.

A synthetic counting diamond 14 having a paramagnetic nitrogen level of less than 150ppm (as determined by ESR techniques) was selected, opposite sides of the diamond being lapped so as to be parallel. (See FIG. 1). The diamond 14 can be a fragment cut from a larger diamond, so that a number of detectors with virtually identical characteristics can be produced from a single diamond.

Contacts 10 and 12 were formed on the counting diamond 14 by implantation of carbon ions, the diamond being maintained at a temperature of 130° C. A highly conductive layer was formed at the surface of the diamond, the layer having higher conductivity at the surface than below the surface of the diamond. The ion energy was varied between 30 and 150 keV, with respective ion doses of $2.5 \times 10^{16}$ ions per cm$^2$. By varying the energy and dose rate of the implanted ions, the depth and conductivity of the conductive regions 10 and 12 can be varied.

The diamond 14 was clamped between gold beads 16 and 18 which were maintained in intimate contact with the conductive regions 10 and 12. A DC voltage from a power supply 20 was applied to the diamond and was varied between $-100$ and $+100$ volts, while the diamond 14 was subjected to ionizing radiation at a constant dose rate. Under these conditions, measurements were made of the current in the circuit of FIG. 2, which was arranged effectively to measure the current through the detector 14 by measuring the voltage across a 100M ohm resistor 22 with an electrometer or a high impedance voltmeter 24. FIG. 3 shows the relationship between the applied voltage and the current, and it can be seen to be very nearly linear.

FIG. 4 illustrates a practical embodiment of a clamping jig used to hold the diamond 14. The jig has a metal frame comprising a base ring 30 of brass, with a top plate 32 supported above the base ring 30 by a pair of legs 34. an insulator plate 36 of alumina is mounted slidably on the legs 34 and is urged away from the base ring 30 by springs 38. Respective bushes 40 and 42 of super pertina are mounted facing one another on the base ring 30 and the insulator 36, and carry respective brass anvils 44 and 46, which in turn carry respective gold ball contacts 48 and 50. The ball contacts 48 and 50 are aligned so that the diamond 14 can be clamped between them.

Mounted in a threaded tube 56 in the top plate 32 is a pressure-adjusting screw 54, the end of which bears on a ball 56 in the insulator plate 36. The screw 54 allows the contact pressure between the diamond 14 and the ball contacts 48 and 50 to be adjusted as desired. An insulated terminal 56 is provided on the top plate 32, which is connected to the ball contact 50 by means of a flexible conductor 58, while the ball contact 48 is electrically connected to a second terminal (not shown). A screened housing 60 for a preamplifier circuit is atached to the bottom of the jig.

FIG. 5 shows a more sophisticated radiation monitoring circuit than the simple test arrangement of FIG. 2. The diamond 14 is held in the jig shown in FIG. 4 and a DC bias voltage is applied across the diamond. A high voltage source 62 provides a stable bias voltage which is applied to one contact of the diamond 14 via a filter comprising a resistor 64 and a capacitor 66, to screen out noise. The second contact of the diamond is connected to earth via a 10M ohm current limiting resistor 68. The frame of the jig is earthed and the anvils 44 and 46 are separately insulated, in order to prevent leakage currents between them. The anvil frames are also made small to reduce capacitance effects.

A high-frequency high input impedance preamplifier 70 based on a field effect transistor is located in the screened housing 60 attached to the jig, and amplifies voltage pulses which appear across the resistor 68. Such voltage pulses occur when current pulses are caused in the diamond 14 by ionizing radiation. The pulse rate can be related to the intensity of the radiation and by counting the number of pulses occuring per unit time, low levels of radiation, (of the order of micro Grays per hour) can be measured. To this end, the output of the preamplifier 70 is fed to a buffer amplifier 72, and then to a pulse-shaping and pulse-height detecting circuit 74 and a pulse counter 76, which can be calibrated to give a readout of radiation intensity in desired units.

Annealing of the ion-implanted diamond can be carried out in order to increase the conductivity of the conductor regions. This is particularly useful if the ion implantation is conducted at relatively low temperatures, for example, below room temperature, in which case the implanted layer is conductive but has a relatively high resistance. It is believed that the improvement in conductivity of the conductor regions after annealing is caused by the conversion of the low density implanted region to a more graphite-like structure. It was found that, using carbon ions, ion implantation at temperatures above 500° C. caused diamond growth instead of the formation of conductive regions.

A metallic film can be applied over the conductive regions to form useful electrical contacts. For example, a silver-loaded epoxy paint was applied to the implanted regions and was found to facilitate electrical connections to the diamond. A conductive epoxy resin can also be applied for this purpose. Metallic ions may be used for the implantation procedure, to promote electrical contact between the conductive layer and the metallic film. Different ions may be used to change the work function of the implanted regions, thus changing the contact field and charge collection characteristics of the regions.

We claim:

1. A method of providing electrical contacts for a diamond detector which is sensitive to ionizing radiation or atomic emissions, including the steps of forming at least two discrete conductive regions extending below the surface of a counting diamond by ion implantation at a temperature below 500° C., and applying respective metallic contacts to the conductive regions to permit charge carriers liberated by the radiation or emissions to be detected by an electronic circuit, so that for a constant dose rate of radiation or emissions, a substantially linear relationship is obtained between a voltage applied to the contacts and a corresponding current through the detector.

2. A method according to claim 1 in which the diamond is selected to have a paramagnetic nitrogen impurity concentration of less than 150 parts per million.

3. A method according to claim 1 in which the diamond is a synthetic diamond.

4. A method according to claim 1 in which the ions are carbon ions.

5. A method according to claim 1 in which the ions are selected metal ions.

6. A method according to claim 1 in which the contacts are applied by applying a metallic paint to the conductive regions.

7. A method according to claim 1 in which the contacts are applied by applying a conductive epoxy resin to the conductive regions.

8. A method according to claim 1 in which the conductivity of the conductive regions is improved by annealing of the diamond subsequent to ion implantation.

9. A detector which is sensitive to ionizing radiation or atomic emissions comprising a counting diamond having at least two discrete conductive regions formed therein and extending below the surface thereof, the conductive regions being formed by ion implantation at a temperature below 500° C., and respective metallic contacts applied to the conductive regions to permit charge carriers liberated by the radiation or emissions to be detected by an electronic circuit, so that for a constant dose rate of radiation or emissions, a substantially linear relationship is obtained between a voltage applied to the contacts and a corresponding current through the detector.

10. A detector according to claim 9 in which the diamond is selected to have a paramagnetic nitrogen impurity concentration of less than 150 parts per million.

11. A detector according to claim 9 in which the diamond is a synthetic diamond.

12. A detector according to claim 9 in which the ions are carbon ions.

13. A detector according to claim 9 in which the ions are selected metal ions.

14. A detector according to claim 9 in which the contacts comprise a metallic paint applied to the conductive regions.

15. A detector according to claim 9 in which the contacts comprise a conductive epoxy resin applied to the conductive regions.

16. A detector according to claim 9 in which the conductivity of the conductive regions is improved by annealing of the diamond subsequent to ion implantation.

17. A method according to claim 1 wherein the ion implantation is carried out at approximately 130° C.

18. A method according to claim 1 wherein the ion energy is between 30 and 150 keV.

19. A method according to claim 1 wherein the ion dose is approximately $2.5 \times 10^{16}$ ions per cm$^2$.

20. A detector according to claim 9 wherein the ion dose is approximately $2.5 \times 10^{16}$ ions per cm$^2$.

* * * * *